US006879021B1

(12) United States Patent
Fitfield et al.

(10) Patent No.: US 6,879,021 B1
(45) Date of Patent: Apr. 12, 2005

(54) ELECTRONICALLY PROGRAMMABLE ANTIFUSE AND CIRCUITS MADE THEREWITH

(75) Inventors: John A. Fitfield, Underhill, VT (US); Wagdi W. Abadeer, Jericho, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,523

(22) Filed: Oct. 6, 2003

(51) Int. Cl.[7] .................................................. H01L 27/12

(52) U.S. Cl. ........................ 257/530; 257/301; 257/306; 257/347; 257/516; 257/518; 257/529; 257/532

(58) Field of Search ................................. 257/529, 530, 257/531, 527, 532; 365/51, 63, 95, 96, 225.7

(56) References Cited

U.S. PATENT DOCUMENTS 5,163,180 A 11/1992 Eltoukhy et al.
5,345,110 A 9/1994 Renfro et al.
5,831,325 A 11/1998 Zhang
5,835,396 A * 11/1998 Zhang ......................... 365/51
6,384,666 B1 5/2002 Bertin et al.
6,426,668 B1 7/2002 Morrish et al.
2002/0075744 A1 * 6/2002 McCollum ............... 365/225.7

* cited by examiner

*Primary Examiner*—Nathan J. Flynn
*Assistant Examiner*—Fazli Erdem
(74) *Attorney, Agent, or Firm*—Downs Rachlin Martin PLLC

(57) ABSTRACT

An antifuse device (120) that includes a bias element (124) and an programmable antifuse element (128) arranged in series with one another so as to form a voltage divider having an output node (F) located between the bias and antifuse elements. When the antifuse device is in its unprogrammed state, each of the bias element and antifuse element is non-conductive. When the antifuse device is in its programmed state, the bias element remains non-conductive, but the antifuse element is conductive. The difference in the resistance of the antifuse element between its unprogrammed state and programmed state causes the difference in voltages seen at the output node to be on the order of hundreds of mili-volts when a voltage of 1 V is applied across the antifuse device. This voltage difference is so high that it can be readily sensed using a simple sensing circuit (228).

24 Claims, 6 Drawing Sheets

ELECTRONICALLY PROGRAMMABLE ANTIFUSE AND CIRCUITS MADE THEREWITH

BACKGROUND OF INVENTION

1. Field of the Invention

The present invention generally relates to the field of integrated circuits. In particular, the present invention is directed to a programmable electronic antifuse and circuits made therewith.

2. Background of the Invention

Programmable fuses and antifuses are devices useful in a variety of integrated circuits (ICs). Programmable fuses and antifuses allow IC designers to "personalize," or custom configure, various circuits to provide the respective circuits with desired functionality and/or reconfigure the circuits to bypass one or more defective elements or utilize redundant elements or circuits to replace defective elements or circuits. A programmable fuse is a device that is closed in its unprogrammed state and open when programmed. Generally, a programmable fuse comprises a fusible conductive link that is broken during programming so that the conductive link no longer closes the circuit.

Programmable fuses are generally of either a laser programmable type or an electronically programmable type. In both types, the fusible conductive link is broken by heating the link sufficiently so as to cause the link to melt. In the laser programmable type of fuse, a laser provides the energy that melts the conductive link. In the electronically programmable type, a relatively large current is passed through the conductive link such that the resistive heating of the link causes the link to melt. Laser programmable fuses are not suitable in many ICs due to the fact that it is often desirable to program the fuses after the IC has been encapsulated and packaged. This is so because laser programmable fuses must be exposed so that a laser beam can be shone upon them in order to melt them. Conventional electronically programmable fuses are generally not desirable for today's CMOS-based ICs due to the high programming voltages and currents required and the non-CMOS fabrication techniques needed to make some fuses that add to the overall cost and complexity of making the ICs.

A programmable antifuse, on the other hand, is a device that is open in its unprogrammed state and closed when programmed. Conventionally, an antifuse comprises two conductive regions separated by an insulating region that electrically insulates the two conductive regions from one another. In its unprogrammed state, the antifuse generally acts as a capacitor, with no current passing from one conductive region to the other. When programmed, however, the insulating ability of the insulating region is at least partially destroyed, allowing current to flow between the two conductive regions. Typically, programming an antifuse results in the formation of a conductive filament that extends within the insulating region between the two conductive regions.

To date, several types of programmable antifuse devices have been proposed and used in various ICs. Generally, all of these types are electronically programmable, i.e., programmable by charging the conductive regions of the antifuses with a voltage high enough to cause the insulating region between these regions to break down sufficiently to cause it to become at least partially conductive. One type of programmable antifuse is a metal-oxide-metal antifuse. This type of antifuse structure is not desirable in CMOS-based ICs because of the non-standard processing techniques needed to fabricate the metal conductive portions of the antifuse.

Another type of conventional programmable antifuse is a polysilicon antifuse having its insulating region made of polysilicon. Although this type of antifuse is compatible with CMOS processing techniques, existing polysilicon antifuses include fusible links that typically require 10 mA to 15 mA of programming current at a voltage higher than needed during normal operation of the IC containing the antifuses. Consequently, the wiring that carries the programming current for such polysilicon antifuses needs to be robust. This increases the area needed for the antifuses and associated wiring. In addition, existing cobalt silicide polysilicon antifuses undergo only a relatively small change in resistance from its unprogrammed state to its programmed state. Therefore, the sensing circuits needed to sense such small resistance changes must be very robust and complex. Such sensing circuits require many elements, and their resistive trip points may need to be adjusted frequently to manage large tails in resistive distributions.

More recently, antifuse designers have utilized current oxide technology in an attempt to improve the density of antifuse devices within ICs and to reduce programming current by at least two orders of magnitude over present polysilicon antifuse technology. In addition to reducing the size of programming wiring, an additional benefit of achieving such low programming currents, e.g., in the microamp regime, is the ability to program hundreds or more antifuses at once, thereby reducing the time needed to program all of the antifuses. Recent efforts utilizing trench or thin-oxide field-effect transistor (FET) structures have had very good results in terms of programming current. Such antifuses have required as little as 1 $\mu$A. However, the resistances of these antifuses in their programmed state are typically in the mega-ohm regime. Techniques for sensing such high-resistance fuses have been shown in the prior art, e.g., in U.S. Pat. No. 6,426,668, entitled "Imbalanced Sense Amplifier Fuse Detection Circuit," owned by the assignee of the present invention, among other publications.

A fundamental problem with antifuses having conducting regions made with semiconductor materials, e.g., when the antifuses are made from CMOS FET structures, is that the conductive filament resulting from programming has a highly non-linear resistance. This characteristic of such antifuses is due to the migration of dopant atoms from the gate and channel of the FET into the gate oxide insulating layer between the gate and channel. Consequently, the resistance is low at high voltages, but very high at the low voltages at which the antifuse will operate once programmed. The result of the very high resistances of the programmed state is that the complex sensing circuits mentioned above must be used to sense the programmed state of the antifuse. While such sensing circuits exist and are effective in discriminating small differences between unprogrammed and programmed resistances, they typically are relatively large circuits having a dynamic design sensitive to noise, voltage variations and process variations. These large sensing circuits result in lower antifuse density and increased circuit complexity.

In view of the foregoing, a need exists for an antifuse technology having a several order of magnitude change between unprogrammed and programmed resistances that can be reliably sensed by a simple sensing circuit, and which can be readily integrated into conventional CMOS processing.

SUMMARY OF INVENTION

In one aspect, the present invention is directed to an antifuse device operable at a voltage thereacross. The antifuse device comprises a first element having a first conductive region, a second conductive region and a tunneling region located between the first and second conductive regions. The tunneling region is operatively configured so that a tunneling current is present between the first and second conductive regions of the first element when the voltage is applied across the antifuse device. A second element having a first conductive region, a second conductive region and a tunneling region is located between the first and second conductive regions. The tunneling region is operatively configured so that a tunneling current is present between the first and second conductive regions of the second element when the voltage is applied across the antifuse device. An output node electrically coupled between the first element and the second element.

In another aspect, the present invention is directed to an integrated circuit chip that comprises functional circuitry and at least one antifuse device operatively connected to the functional circuitry. The at least one antifuse device comprises a first element having a first conductive region, a second conductive region and a tunneling region located between the first and second conductive regions. The tunneling region is operatively configured so that a tunneling current is present between the first and second conductive regions of the first element when the voltage is applied across the antifuse device. A second element having a first conductive region, a second conductive region and a tunneling region located between the first and second conductive regions. The tunneling region is operatively configured so that a tunneling current is present between the first and second conductive regions of the second element when the voltage is applied across the antifuse device. An output node is electrically coupled between the first element and the second element. A programming circuit is in electrical communication with the second element and operatively configured to cause the tunneling region of the second element to become conductive when the programming circuit is energized.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 1:
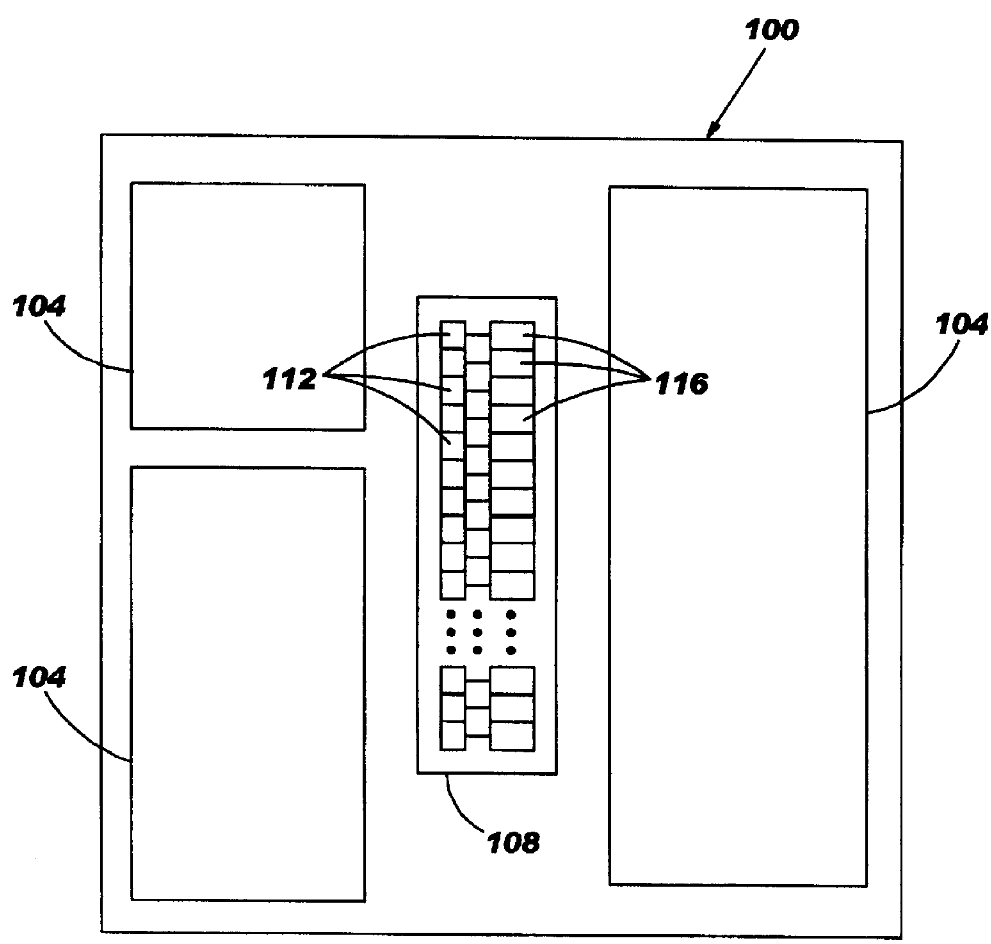
FIG. 1 is a high-level schematic diagram of an integrated circuit chip of the present invention.

Referring now to the drawings, FIG. 1 shows in accordance with the present invention an integrated circuit (IC) chip, which is generally denoted by the numeral 100. Chip 100 may be any type of IC chip, such as an application-specific IC (ASIC) chip, memory chip, microprocessor chip or system-on-chip, among others. Chip 100 may provide any one or more functions needed to suit a particular design. For example, chip 100 may include various regions 104 containing, e.g., memory, I/O, communication and/or logic circuitry, among others. Those skilled in the art will readily appreciate that the particular function(s) that chip 100 provides is/are not material to the understanding of the present invention. Therefore, these functions are not described herein.

Chip 100 may include at least one antifuse region 108 containing one or more electronically programmable antifuse devices 112 and/or sensing circuits 116 for sensing the programming state of each antifuse device. Generally, each antifuse device 112 has a programmed state and an unprogrammed state useful for tasks such as personalizing, or custom configuring, various circuits (not shown) within regions 104 aboard chip 100 so as to provide the respective circuits with desired functionality and/or reconfigure the circuits to bypass one or more defective elements or utilize redundant elements or circuits to replace defective elements or segments. A more detailed explanation of the use of antifuse devices 112 and sensing circuits 116 is not necessary herein, since the use of antifuses is well established and practiced in the art.

Figure 2:
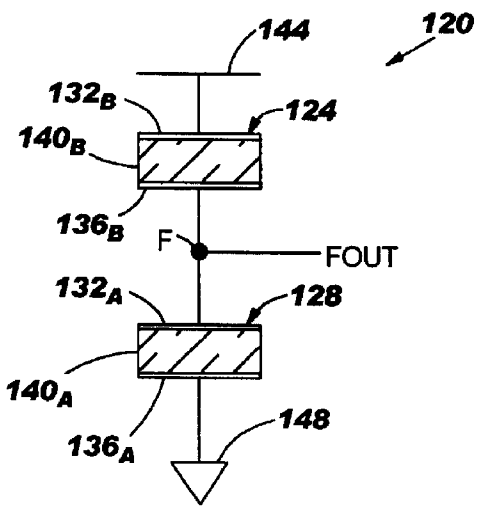
FIG. 2 is a schematic diagram of an antifuse device according to the present invention.

FIG. 2 illustrates an antifuse device 120 of the present invention that may be used for each antifuse device 112 of chip 100 of FIG. 1. Antifuse device 112 may be referred to as a "two element" device due to it containing two primary elements, a tunneling bias element 124 and a tunneling antifuse element 128 electrically connected to one another in series. Generally, each of bias element 124 and antifuse element 128 may comprise a first conductive region $\mathbf{132}_B$, $\mathbf{132}_A$ and a second conductive region $\mathbf{136}_B$, $\mathbf{136}_A$, respectively, separated from one another by a tunneling region $\mathbf{140}_B$, $\mathbf{140}_A$. Each tunneling region $\mathbf{140}_B$, $\mathbf{140}_A$ comprises a dielectric material having an electrical and/or physical thickness that allows a tunneling current to flow between the respective first and second conductive regions $\mathbf{132}_B$, $\mathbf{136}_B$ and $\mathbf{132}_A$, $\mathbf{136}_A$ without measurable breakdown of the dielectric material when a certain voltage is applied across element 124, 128. Classical tunneling current is a well-established phenomenon utilized in conventional circuit elements, such as the so-called "tunneling diode," among others. Therefore, a detailed explanation of classical tunneling current and the physics behind tunneling current are not necessary for those skilled in the art to practice the present invention to its broad scope.

In this connection, it is noted that the term "tunneling current" as used herein and in the appended claims shall include not only classic tunneling current, but also leakage current that can be present across certain dielectric materials, even without classical tunneling current being present. This definition of "tunneling current" recognizes the fact that a current having a magnitude on the order of a tunneling current can be achieved without tunneling, e.g., by using a "leaky" dielectric layer comprising either an inherently leaky dielectric material, e.g., tantalum oxide, or an inherently non-leaky material provided with impurities that render the layer leaky. Typically, leakage current that flows through an element will be about two orders, more or less, of magnitude smaller that the current that flows through that element when the element is "conductive," as this term is defined below. Similarly, the terms "tunneling bias element, ""tunneling antifuse element,""tunneling region" and similar terms shall encompass elements having either tunneling current or leakage current, or both, thereacross. In addition, it is also noted that the term "essentially nonconductive" is used herein and in the appended claims relative to an element, such as bias and antifuse elements 124, 128, to indicate that the element conducts a tunneling and/or leakage current across a dielectric layer that does not otherwise permit current to flow. In contrast, the term "conductive" as used herein and in the appended claims relative to such an element indicates that the dielectric layer has been changed, e.g., by the formation of a conductive filament, to an extent that current flows through the element primarily by a mode other than tunneling and/or leakage.

Each of bias and tunneling elements 124, 128 may be implemented using any suitable device, such as a parallel plate capacitor or a field-effect transistor (FET), among others. If bias and/or antifuse elements 124, 128 are implemented as FETs, as discussed below, they may be implemented as either nFET or pFET devices and may be utilized in either inversion or accumulation mode as needed to suit a particular design. However, it is noted that while the structures of bias and tunneling elements 124, 128 may take a variety of forms, much of the description below is directed to the elements being pFET devices. Generally, this is so due to these devices being most prevalent and readily fabricated using conventional CMOS processing techniques that are widely used in the IC manufacturing industry today. That said, those skilled in the art will understand how to implement bias and antifuse elements 124, 128 with any suitable non-pFET devices.

Conductive regions $\mathbf{132}_B$, $\mathbf{136}_B$, $\mathbf{132}_A$, $\mathbf{136}_A$ may be made of any suitable conductive material, such as a metallic material or a semiconductor material. When bias and antifuse elements 124, 128 are either parallel plate capacitors or FETs, tunneling regions $\mathbf{140}_B$, $\mathbf{140}_A$ will comprise a dielectric layer comprising, e.g., silicon dioxide, silicon nitride or other dielectric material.

Antifuse device 120 further includes an output node F located between bias element 124 and antifuse element 128. Biasing element 124 may be connected to a power rail 144 (or ground rail in certain embodiments, such an nFET dual of antifuse device) and antifuse element 128 may be connected to a power rail 148. As those skilled in the art will appreciate, since bias element 124 and antifuse element 128 are each designed to pass tunneling currents when connected between rails 144, 148 as shown, these elements may be considered resistive elements having finite, albeit relatively large, resistances. Accordingly, as discussed below, antifuse device 120 has characteristics similar to that of a simple voltage divider, wherein the output voltage FOUT appearing at node F can be controlled by adjusting the relative resistances of bias element 124 and antifuse element 128.

Figure 3:
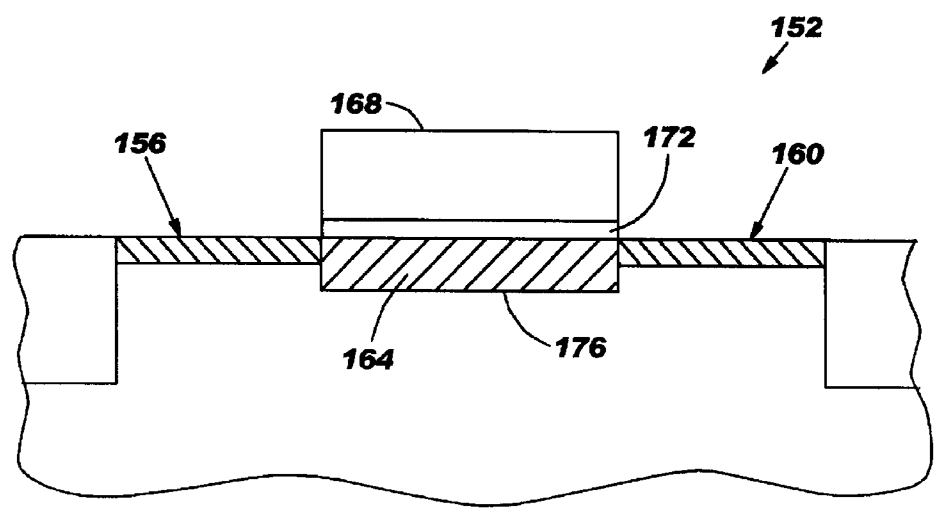
FIG. 3 is an enlarged cross-sectional view of a pFET suitable for use in the antifuse device of FIG. 2.

Generally, the relative resistances of bias element 124 and unprogrammed antifuse element 128 may be adjusted by adjusting the amount of tunneling current permitted to pass through the bias element and the antifuse element in its unprogrammed state. In one embodiment, each of bias element 124 and antifuse element 128 may be made using a conventional FET structure 152 as shown in FIG. 3. FET structure 152 may include a source 156, drain 160, channel 164, gate 168 and gate oxide layer 172 made using conventional processing techniques, such as CMOS processing techniques. When each of bias and antifuse elements 124, 128 is embodied in an FET structure, such as FET structure 152, variables that affect the tunneling current through oxide layer 172 include the physical thickness of the oxide layer and the physical area of gate 168 in contact with the oxide layer, since, for a given dielectric material for the oxide layer, tunneling current increases (and resistance decreases) with decreasing physical thickness of the oxide layer and increasing area of the gate.

Other variables being equal, tunneling current may also be increased (and resistance decreased) when a tunneling implant region 176 is provided adjacent oxide layer 172. Tunneling implant region 176 may be implanted with certain dopants that promote tunneling. For example, when FET structure 152 is of the p-type, implant region 176 may be implanted with a high dose of phosphorous atoms. When FET structure 152 is of the n-type, implant region 176 may be implanted with a high dose of boron atoms. Those skilled in the art will appreciate that other dopants may be used.

Figure 4:
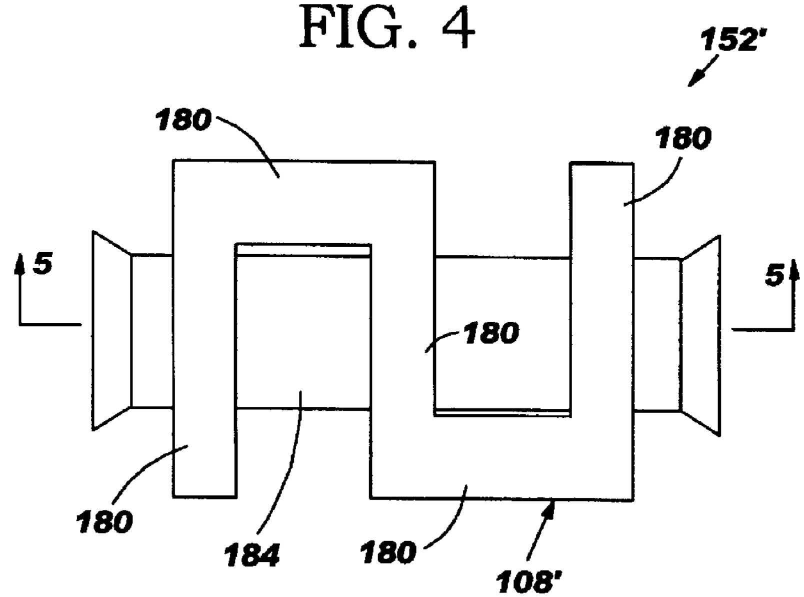
FIG. 4 is a plan view of a multi-fingered antifuse element suitable for use in the antifuse device of FIG. 2.
Figure 5:
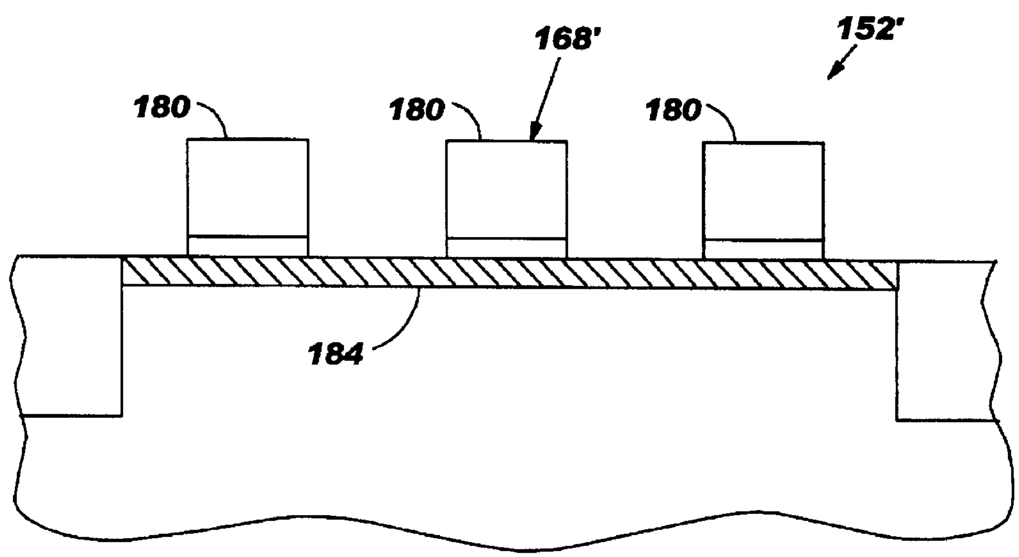
FIG. 5 is an enlarged cross-sectional view as taken along line 5—5 of FIG. 4.

Referring again to FIG. 2, and also to FIG. 3, in order for a tunneling current to be present on each of bias and antifuse elements 124, 128, tunneling region $\mathbf{140}_B$, $\mathbf{140}_A$ will typically be very thin. For example, when tunneling region $\mathbf{140}_B$, $\mathbf{140}_A$ is made of silicon dioxide, a dielectric commonly used for gate oxide layer 172 when made using conventional CMOS processing, the thickness of the gate oxide layer will be about 17 Å or less. It has been observed that the tunneling current for one example of antifuse element 128 is about 2.28 nA/($\mu m^2$ of oxide layer area) at 1 V when gate oxide layer 172 is a 17 Åthick silicon dioxide layer. Generally, the thinner gate oxide layer 172 is made, the higher the tunneling current will be. The area of gate 168 may be made any size needed to suit a particular design. In addition to varying the length and/or width of gate 168, a gate 168' may include multiple segments 180, such as shown in FIGS. 4 and 5, so as to increase the gate area. In FIGS. 4 and 5, gate 168' comprises five segments 180, three of which extend over the junction of FET structure 152'.

Figure 6:
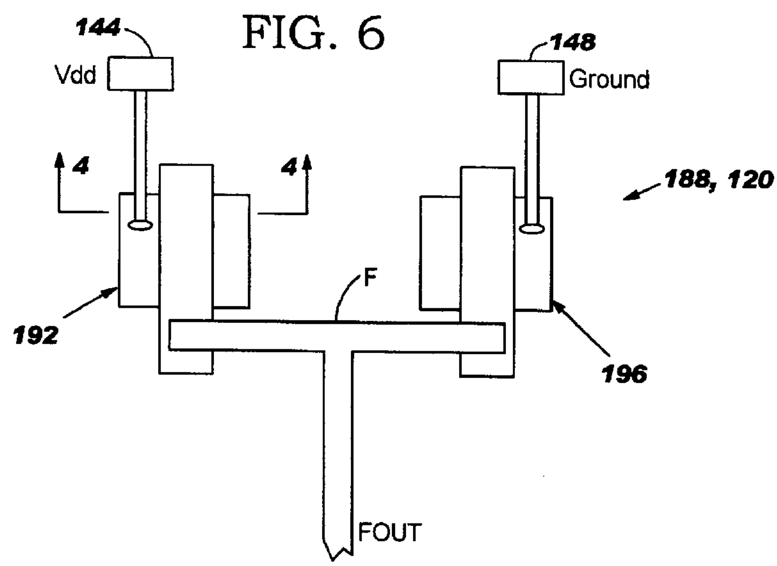
FIG. 6 is a plan view of the antifuse device of FIG. 1 implemented with FETs made using CMOS processing techniques.
Figure 7A:
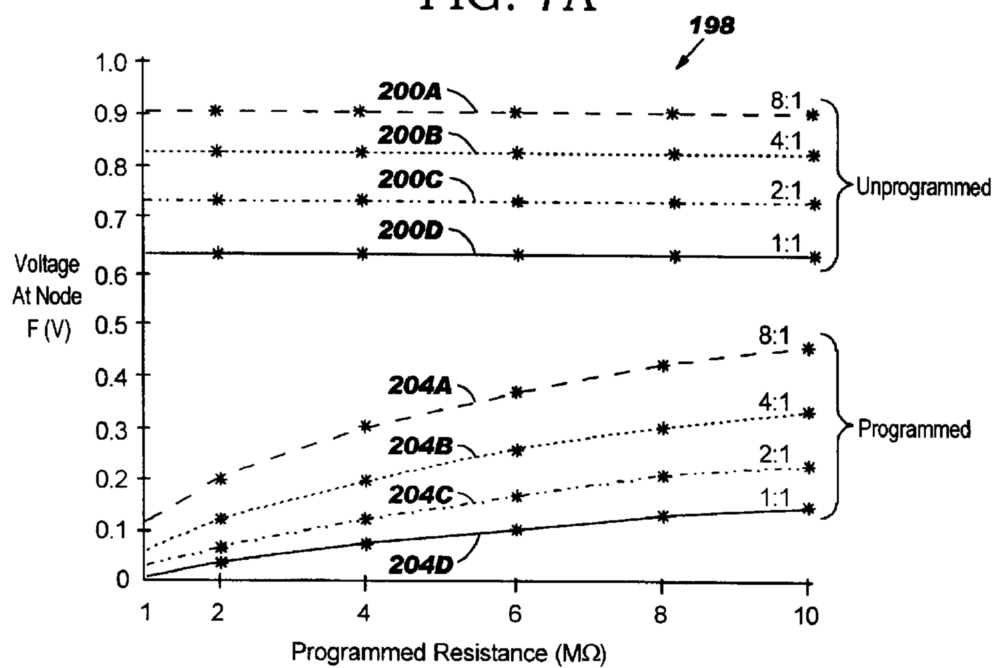
FIG. 7A is graph of (1) the voltage at node F of an exemplary pFET antifuse device for several ratios of the area of the biasing pFET to the area of the antifuse pFET when the antifuse pFET is unprogrammed and (2) the voltage at node F for the same ratios as a function of programmed antifuse resistance.

FIG. 6 shows an exemplary antifuse device structure 188 corresponding to antifuse device 120 of FIG. 2 wherein each of bias and antifuse elements 124, 128 are implemented as pFETs 192, 196, respectively. Generally, when the ratio of the gate area of bias pFET 192 to the gate area of antifuse pFET 196 is 1:1 or greater, the voltage seen at node F (FOUT) is a relatively large fraction of the voltage across antifuse device 120, e.g., Vdd, when the antifuse pFET is unprogrammed. FIG. 7A is a graph 198 illustrating the voltages seen at node F (FOUT), as expressed by lines, 200A, 200B, 200C, 200D for various ratios of the gate area of bias pFET 192 to the gate area of antifuse pFET 196 when the antifuse pFET is unprogrammed and the voltage across antifuse device is 1 volt. As shown in FIG. 7A, for ratios of gate area of bias pFET 192 to gate area of antifuse pFET 196 of 1:1, 2:1, 4:1 and 8:1, the voltages seen in antifuse device 120 at node F (FOUT) are about 635 mV, 730 mV, 825 mV and 905 mV, respectively. It is noted that lines 200A, 200B, 200C, 200D are linear because the unprogrammed resistance of antifuse pFET 196 is essentially constant. Of course, as discussed in the immediately preceding paragraph, while the ratio of tunneling currents (resistances) of bias and antifuse pFETs 192, 196 was adjusted by changing the gate area of the bias pFET, the ratio could alternatively, or additionally, be adjusted by changing other parameters, such as the relative thicknesses of the oxide layers and the amount of tunneling current enhancing doping.

Referring again to FIG. 2, once bias element 124 and antifuse element 128 have been fabricated with a certain ratio of tunneling currents (resistances) so as to achieve a desired unprogrammed voltage FOUT at node F, the antifuse element may now be programmed to provide the antifuse element with a much lower resistance, if desired. Programming antifuse element 128 involves applying a programming voltage across the antifuse element of a magnitude sufficient to cause a dielectric breakdown within tunneling region $\mathbf{140}_A$. Generally, the dielectric breakdown in tunneling region $\mathbf{140}_A$ will cause a conductive filament (not shown) to form between conductive regions $\mathbf{132}_A$, $\mathbf{136}_A$, allowing a certain amount of current to flow through antifuse element 128 that is relatively large compared to the tunneling current. The resistance of antifuse element 128 when programmed can be varied by changing the programming voltage. Higher programming voltages generally result in increased dielectric breakdown, which allows more current to flow conductively across tunneling region $\mathbf{140}_A$, thereby decreasing the effective resistance of antifuse element 128. Programming currents for antifuse element 128 of the present invention are generally on the order of 100 $\mu$A or less, which does not require overly large and robust programming wiring. In addition, such low programming currents allow many, e.g., tens, hundreds or more, antifuse devices to be programmed simultaneously with one another.

Once antifuse element 128 has been programmed, voltage FOUT appearing at node F at a certain voltage applied across antifuse device 120 will be much less than the voltage FOUT that appears at node F at the same applied voltage when the antifuse element is unprogrammed. This is illustrated in FIG. 7A for exemplary pFET antifuse structure 188 of FIG. 6. As seen in FIG. 7A, for ratios of the gate area of bias pFET 192 to the gate area of antifuse pFET 196 of 1:1, 2:1, 4:1 and 8:1, the voltages FOUT seen in antifuse device 188 at node F, as represented by lines 204A, 204B, 204C, 204D, respectively, vary non-linearly as a function of the programmed resistance. Generally, it appears that for pFET antifuse device 188, the voltages FOUT seen at node F when the programmed resistance of antifuse pFET 196 is relatively low, e.g., 1 MΩ, are less sensitive to the ratio of the gate areas than the voltages FOUT at node F when the programmed resistance of the antifuse pFET is relatively high, e.g., 10 MΩ. For example, at a programmed resistance of 1 MΩ, the difference in voltage FOUT at node F from a ratio of 1:1 (line 204D) to a ratio of 8:1 (line 204A) is only about 100 mV (about 20 mV to about 120 mV, respectively), whereas the difference in voltage FOUT at node F from a ratio of 1:1 to a ratio of 8:1 at a programmed resistance of 10 MΩ is about 310 mV (about 150 mV to about 460 mV, respectively).

However, regardless of how voltage FOUT seen at node F varies with respect to the programmed resistance of antifuse device 120 and/or ratio of gate areas, an important point to note from FIG. 7A is the sheer magnitude of the difference in voltages seen at node F between the unprogrammed state and programmed state of antifuse pFET 196, and, more generally, antifuse element 128 of FIG. 2. As can be seen in FIG. 7A, the smallest difference in voltage FOUT seen at node F (FIG. 6) between the unprogrammed and programmed states of antifuse pFET 196 is about 450 mV (about 910 mV on line 200A to about 460 mV on line 204A), which occurs at a programmed resistance of 10 MΩ and a gate area ratio of 8:1. As discussed below in more detail, a difference of 450 mV can be readily sensed by a simple sensing circuit. In contrast, the largest difference in voltage FOUT seen at node F between the unprogrammed and programmed states of antifuse pFET 196 is about 790 mV (about 910 mV on line 200A to about 120 mV on line 204A), which occurs at a programmed resistance of 1 MΩ and a gate area ratio of 8:1. The unprogrammed and programmed voltages of 910 nV and 120 mV are virtually in the realm of logic-level voltages. Such differences in voltages may be readily sensed for determining the programming state of antifuse device.

Figure 7B:
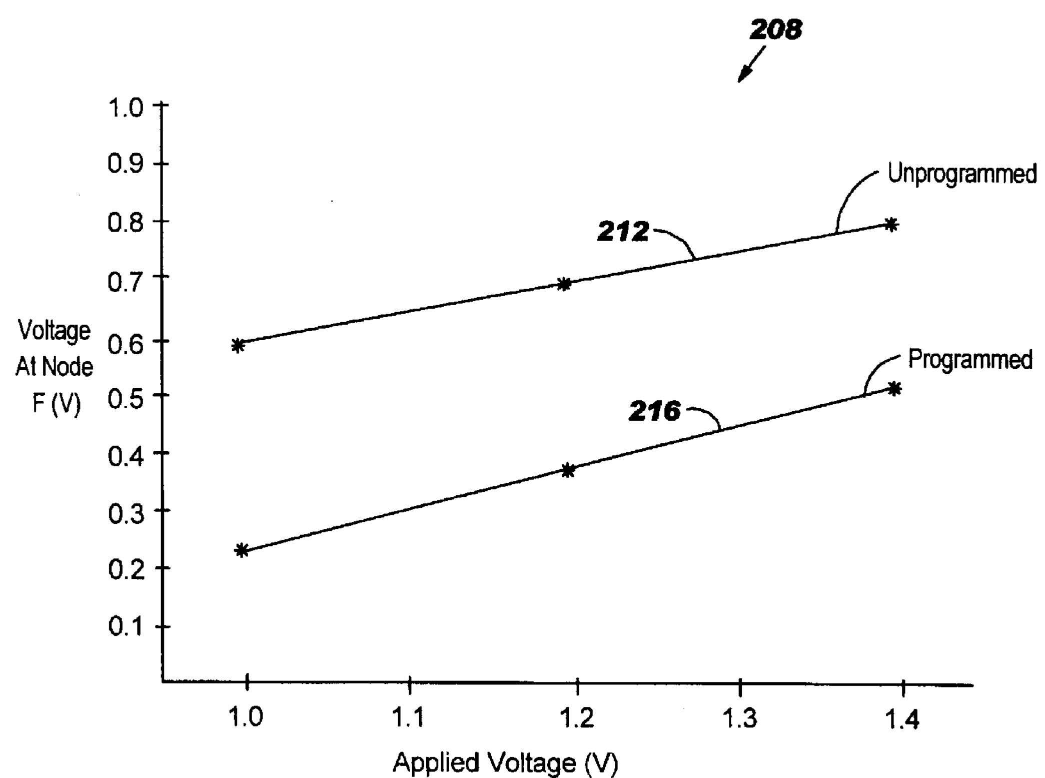
FIG. 7B is a graph of the unprogrammed and programmed voltage at node F for different voltages applied across the pFET antifuse device.

FIG. 7B is a graph showing unprogrammed and programmed voltage profiles 212, 216 at node F (FIG. 6) versus the voltage applied between power rail 144 and ground rail 148. As can be seen, both the unprogrammed and programmed voltages are generally well behaved and stable enough relative to changes in applied voltage to be sensed using a sensing circuit (244, FIG. 8) comprising a simple inverter. Since the sensing circuit needs only an inverter, very little space is needed to implement the sensing circuit. This, in combination with the fact that, as discussed above, the programming wiring (not shown) need not be unduly large, permit antifuse region 108 (FIG. 1) to be highly densified, saving valuable area aboard chip 100. An additional benefit to needing only a simple inverter to sense the programming state of the antifuse is the fact that the sensing circuit does not require any latches. As those skilled in the art will appreciate, a latchless design eliminates soft errors in the sensing circuit. Another benefit of a latchless design is that the sensing circuit is radiation hardened. That is, a radiation event, i.e., bombardment by a radiation particle, will not cause a critical error that can only be corrected upon reset. Rather, since the state of antifuse device 120 (FIG. 2) is represented by direct current (DC) signals, i.e., DC voltages at node F, a radiation event will only cause a transient in the signal, which will self-correct once the radiation event has ended. Of course, those skilled in the art will appreciate that while a latchless sensing circuit may be desirable in certain designs, sensing circuits that include latches may be used in the alternative, if needed to suit a particular design.

Figure 8:
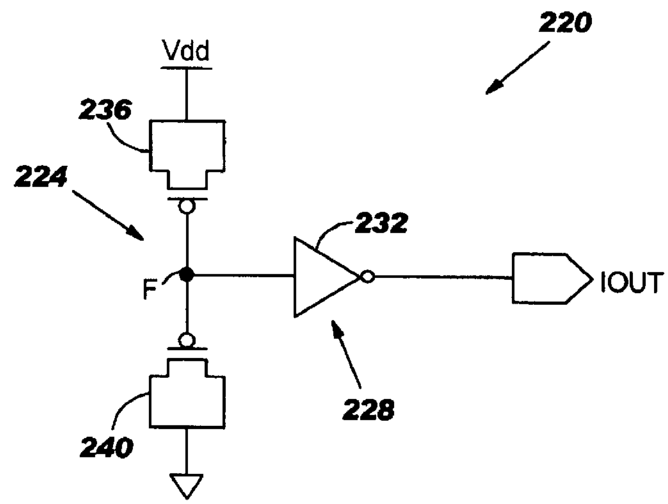
FIG. 8 is a schematic diagram of an antifuse/sensing circuit of the present invention.

FIG. 8 illustrates an antifuse/sensing circuit 220 of the present invention that includes an antifuse device 224 in combination with a sensing circuit 228. Sensing circuit 228 is in electrical communication with output node F and may be provided for sensing the programming state of antifuse device 224, i.e., whether antifuse device has been programmed or remains unprogrammed. Sensing circuit 228 may comprise an inverter 232 and an output IOUT for providing the logic-level digital output of the inverter to other circuitry (not shown). In the embodiment shown, antifuse device 224 comprises a bias pFET 236 and an antifuse pFET 240, each of which may be a thin-oxide device having a tunneling current at a voltage, such as voltage Vdd. Antifuse device 220 generally functions in the manner described above in connection with antifuse devices 120, 188 of FIGS. 2 and 6, respectively, so as to induce an unprogrammed voltage, e.g., 900 mV, at node F when the voltage Vdd across the device is 1.2 V and a programmed voltage, e.g., 120 mV, at node F at the same applied voltage. In this example, the difference between the unprogrammed and programmed voltages is 780 mV, which is more than adequate for being sensed by inverter 232. Inverter 232 may be an ordinary two element "thick", i.e., non-tunneling, gate inverter well known in the prior art. Those skilled in the art will readily appreciate that, with the relatively large difference in voltage at node F between the unprogrammed and programmed states of antifuse device 224, inverter 232 may be replaced with a logic gate, e.g., an AND, OR, NAND or NOR gate, so as to convert the output voltage at node F to a full logic level digital signal, if needed. Additionally, if power usage is a design concern, a simple gated inverter (not shown) may be used.

Figure 9:
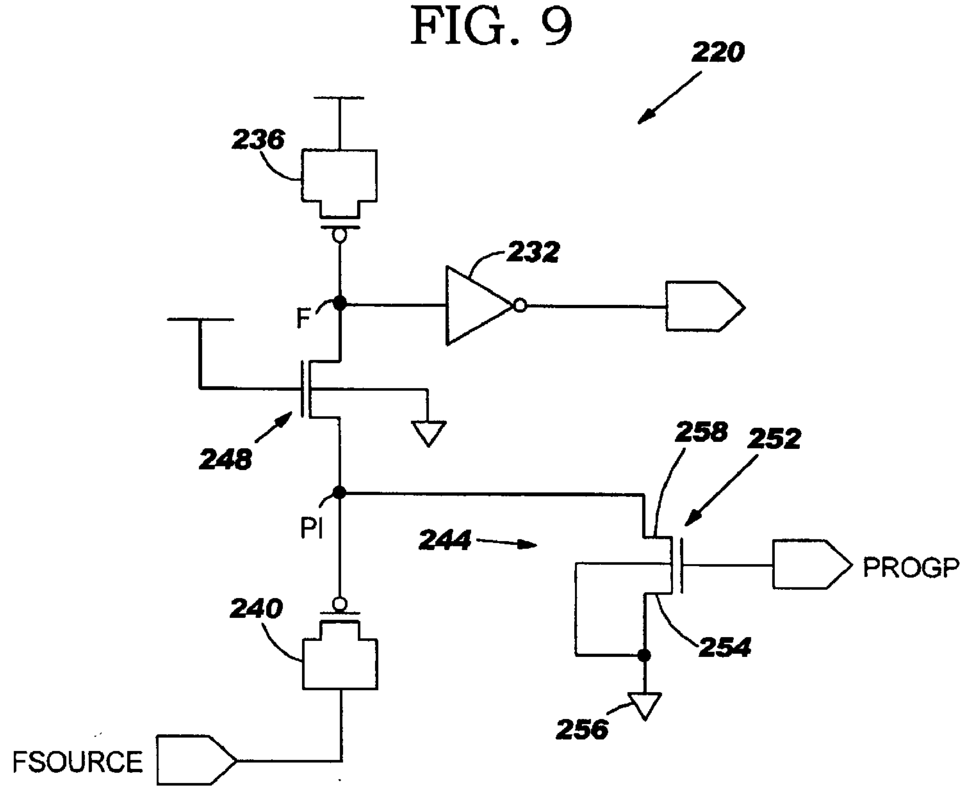
FIG. 9 is a schematic diagram of an antifuse/sensing/programming circuit of the present invention.

FIG. 9 illustrates antifuse/sensing circuit 220 of FIG. 8 in conjunction with a programming circuit 244 and an antifuse element protection device 248 for protecting bias pFET 236 and other elements, e.g., inverter 232, from the relatively large programming voltage provided via node FSOURCE. As mentioned above, a benefit of antifuse pFET 240, and other tunneling antifuse elements of the present invention, is that they can be programmed with relatively very little programming current, typically on the order of 100 μA or less.

Programming circuit 244 may be electrically connected to antifuse/sensing circuit at programming node P1 located between isolation device 248 and antifuse element 240. Programming circuit 244 may include a thick-oxide transistor 252 having its source 254 electrically connected to a ground 256 and a programming input PROGP electrically connected to gate 258 of the transistor. Under nonprogramming conditions, input PROGP is held low so that transistor 252 is open. However, during programming input PROGP is made high, thereby closing transistor 252 to provide a conductive path from node FSOURCE through antifuse pFET to ground 256. While transistor 252 is high, a relatively large programming voltage, e.g., on the order of 3.5 V when the gate oxide layer thickness of antifuse pFET 240 is 17 Å, is applied to node FSOURCE to induce that voltage across the antifuse pFET so as to cause the dielectric material in the tunneling region (gate oxide layer) of the antifuse pFET to break down, thereby forming a conductive filament (not shown) through the tunneling region. Once the conductive filament has formed, the programming voltage is removed from node FSOURCE and input PROGP is once again made low. Antifuse pFET 240 is now programmed.

As discussed above, the presence of the conductive filament makes antifuse pFET 240 conductive, thus lowering its resistance relative to its resistance when only a tunneling current is present. The resistance of antifuse pFET 240 in its programmed state is typically on the order of 1MΩ to 10 MΩ, more typically 1 MΩ to 5 MΩ when the antifuse is a pFET device as shown having a gate oxide thickness of about 17 Å, but may be more or less depending upon the particular device used to make the antifuse element. As mentioned above, with the relatively small programming currents and voltages needed to program a single antifuse element 128 (FIG. 2) of the present invention, many, e.g., on the order of hundreds or more, may be programmed simultaneously. Those skilled in the art will appreciate the modifications necessary to programming circuit 244 to enable such simultaneous programming such that a detailed description of these modifications is not necessary herein. In addition, of course, programming circuit 244 may be different from the programming circuit shown.

While the present invention has been described in connection with a preferred embodiment, it will be understood that it is not so limited. On the contrary, it is intended to cover all alternatives, modifications and equivalents as may be included within the spirit and scope of the invention as defined above and in the claims appended hereto.

What is claimed is:

1. An antifuse device operable at a voltage thereacross, comprising:

(a) a first element having a first conductive region, a second conductive region and a tunneling region located between said first and second conductive regions, said tunneling region operatively configured so that a tunneling current is present between said first and second conductive regions of said first element when the voltage is applied across the antifuse device;

(b) a second element having a first conductive region, a second conductive region and a tunneling region located between said first and second conductive regions, said tunneling region operatively configured so that a tunneling current is present between said first and second conductive regions of said second element when the voltage is applied across the antifuse device; and (c) an output node electrically coupled between said first element and said second element.

2. An antifuse device according to claim 1, wherein the antifuse device has a programming state and further comprises a sensing circuit electrically coupled to said output node, said sensing circuit operatively configured for sensing the programming state and outputting the programming state as a logic-level signal.

3. An antifuse device according to claim 2, wherein said sensing circuit is a latchless sensing circuit.

4. An antifuse device according to claim 1, wherein said sensing circuit consists essentially of an inverter.

5. An antifuse device according to claim 1, wherein the antifuse device has an unprogrammed state and a programmed state and said output node has a corresponding unprogrammed voltage and programmed voltage when the voltage is applied across the antifuse device, the difference between said unprogrammed voltage and said programmed voltage being at least 400 mV when the voltage is 1 volt.

6. An antifuse device according to claim 5, wherein the difference between said unprogrammed voltage and said programmed voltage being at least 700 mV when the voltage is 1 volt.

7. An antifuse device according to claim 1, wherein said second element has an unprogrammed state and a programmed state, wherein in said unprogrammed state said tunneling region of said second element is essentially nonconducting when the voltage is applied across the antifuse device and in said programmed state said tunneling region of said second element is conducting when the voltage is applied across the antifuse device.

8. An antifuse device according to claim 7, further comprising a programming circuit operatively configured for changing said unprogrammed state to said programmed state.

9. An antifuse device according to claim 8, further comprising an isolation element located between said first said second elements, said isolation element operatively configured to isolate said first element from said second element while said programming circuit is programming said second element.

10. An antifuse device according to claim 1, wherein said tunneling region of said second element comprises a thin oxide layer.

11. An antifuse device according to claim 10, wherein said tunneling region of said first element comprises a thin oxide layer.

12. An antifuse device according to claim 11, wherein said thin oxide layer has an equivalent electrical thickness of no more than about 19 Å.

13. An antifuse device according to claim 1, wherein each of said first and second elements is made from a semiconductor capacitor.

14. An antifuse device according to claim 1, wherein each of said first and second elements is made from a semiconductor transistor.

15. A programmable antifuse device, comprising:

(a) a first element having a first conductive region, a second conductive region and a tunneling region located between said first and second conductive regions, said tunneling region operatively configured so that a tunneling current is present between said first and second conductive regions of said first element when the voltage is applied across the antifuse device;

(b) a second element having a first conductive region, a second conductive region and a tunneling region located between said first and second conductive regions, said tunneling region operatively configured so that a tunneling current is present between said first and second conductive regions of said second element when the voltage is applied across the antifuse device; and (c) a programming circuit in electrical communication with said second element and operatively configured to cause said tunneling region of said second element to become conductive when said programming circuit is energized.

16. An antifuse device according to claim 15, wherein each one of said bias and antifuse elements is a thin-oxide device.

17. An antifuse device according to claim 15, further comprising a sensing circuit, electrically coupled between said first and second elements, operatively configured to sense the conductive state of said second element.

18. An antifuse device according to claim 17, wherein said sensing circuit is a latchless circuit.

19. An antifuse device according to claim 17, wherein said sensing circuit consists essentially of an inverter.

20. An antifuse device according to claim 15, further comprising an output node electrically coupled between said first and second elements and wherein the antifuse device has an unprogrammed state and a programmed state and said output node has a corresponding unprogrammed voltage and programmed voltage when the voltage is applied across the antifuse device, the difference between said unprogrammed voltage and said programmed voltage being at least 500 mV when a voltage of 1 volt is applied across said first and second elements.

21. An integrated circuit chip, comprising:

(a) functional circuitry;

(b) at least one antifuse device operatively connected to said fictional circuitry, said at least one antifuse device comprising:

(i) a first element having a first conductive region, a second conductive region and a tunneling region located between said first and second conductive regions, said tunneling region operatively configured so that a tunneling current is present between said first and second conductive regions of said first element when the voltage is applied across the antifuse device;

(ii) a second element having a first conductive region, a second conductive region and a tunneling region located between said first and second conductive regions, said tunneling region operatively configured so that a tunneling current is present between said first and second conductive regions of said second element when the voltage is applied across the antifuse device; and (iii)an output node electrically coupled between said first element and said second element; and (c) a programming circuit in electrical communication with said second element and operatively configured to cause said tunneling region of said second element to become conductive when said programming circuit is energized.

22. An integrated circuit chip according to claim 21, further comprising a sensing circuit, electrically coupled between said first and second elements, operatively configured to sense the conductive state of said second element.

23. An antifuse device according to claim 17, wherein said sensing circuit is a latchless circuit.

24. An antifuse device according to claim 17, comprising a plurality of antifuse devices comprising a corresponding plurality of second elements comprising a corresponding plurality of tunneling regions, said programming circuit in electrical communication with said plurality of antifuse devices and configured to cause said plurality of tunneling regions to become conductive substantially simultaneously with one another when said programming circuit is energized.

* * * * *